(12) United States Patent
Juergens et al.

(10) Patent No.: US 10,852,643 B2
(45) Date of Patent: Dec. 1, 2020

(54) OPTICAL SYSTEM, AND METHOD

(71) Applicant: Carl Zeiss SMT GmbH, Oberkochen (DE)

(72) Inventors: Dirk Juergens, Lauchheim (DE); Kerstin Hild, Schwaebisch Gmuend (DE); Bernd Geh, Scottsdale, AZ (US)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/578,691

(22) Filed: Sep. 23, 2019

(65) Prior Publication Data

US 2020/0073252 A1 Mar. 5, 2020

Related U.S. Application Data

(63) Continuation of application No. PCT/EP2018/055923, filed on Mar. 9, 2018.

(Continued)

(30) Foreign Application Priority Data

May 18, 2017 (DE) .................. 10 2017 208 364

(51) Int. Cl.
*G03F 7/20* (2006.01)
*G02B 26/08* (2006.01)

(52) U.S. Cl.
CPC ...... *G03F 7/70266* (2013.01); *G03F 7/70825* (2013.01); *G02B 26/0825* (2013.01)

(58) Field of Classification Search
CPC ............. G03F 7/70266; G03F 7/70825; G03F 7/7015; G03F 7/70191; G03F 7/702;

(Continued)

(56) References Cited

U.S. PATENT DOCUMENTS

| 7,859,643 B2 | 12/2010 | Asada |
| 2004/0027632 A1* | 2/2004 | Watson ................ G02B 7/1827 359/223.1 |
| 2004/0150871 A1* | 8/2004 | Yang .................. G02B 26/0825 359/291 |
| 2004/0202898 A1 | 10/2004 | Van Dijsseldonk et al. |
| 2004/0212792 A1* | 10/2004 | Miyajima ........... G03F 7/70825 355/53 |
| 2005/0002087 A1 | 1/2005 | Knowles et al. |

(Continued)

FOREIGN PATENT DOCUMENTS

DE 603 15 986 T2 5/2008
DE 10 2011 081 603 A1 10/2012

(Continued)

OTHER PUBLICATIONS

Translation of International Search Report for corresponding Appl No. PCT/EP2018/055923, dated Sep. 5, 2018.

*Primary Examiner* — Christina A Riddle
(74) *Attorney, Agent, or Firm* — Fish & Richardson P.C.

(57) ABSTRACT

An optical system for a lithography machine includes: a main mirror element and a manipulator device for positioning and/or orienting said main mirror element. The optical system also includes an optically active surface for reflecting radiation. The optical system further includes an actuator matrix positioned between the main mirror element and the optically active surface. The actuator matrix is configured to deform the optically active surface to influence the reflective properties of the optically active surface. A gap is present between the actuator matrix and a front side of the main mirror element so that the actuator matrix is spaced apart from the main mirror element.

19 Claims, 9 Drawing Sheets

Related U.S. Application Data

(60) Provisional application No. 62/478,121, filed on Mar. 29, 2017.

(58) Field of Classification Search
CPC ............. G03F 7/70233; G03F 7/70258; G03F 7/70308; G03F 7/70316; G03F 7/7055; G03F 7/70591; G03F 7/706; G03F 7/70858; G03F 7/70883; G03F 7/70891; G03F 7/7095; G03F 7/70958; G03F 7/70141; G03F 7/70975; G02B 26/0825; G02B 26/085; G02B 26/0858; G02B 5/08; G02B 5/0808; G02B 5/0816–0875; G02B 5/0891
USPC .......... 355/30, 52–55, 66–71, 77; 250/492.1, 250/492.2, 492.22, 505.1, 504 R; 378/34, 378/35; 359/350, 359, 360, 838–884
See application file for complete search history.

(56) References Cited

U.S. PATENT DOCUMENTS

| | | | |
|---|---|---|---|
| 2005/0023573 A1* | 2/2005 | Govil | G02B 26/0825 257/223 |
| 2005/0105066 A1 | 5/2005 | Franken | |
| 2005/0146701 A1* | 7/2005 | Holderer | G02B 17/08 355/67 |
| 2007/0280609 A1 | 12/2007 | Hirohito | |
| 2012/0182533 A1* | 7/2012 | Schoeppach | G02B 17/0657 355/66 |
| 2014/0085740 A1* | 3/2014 | Rooms | G02B 26/0825 359/846 |
| 2014/0125995 A1* | 5/2014 | Schoeppach | G03F 7/70266 356/601 |

FOREIGN PATENT DOCUMENTS

| | | |
|---|---|---|
| DE | 10 2011 075 316 A1 | 11/2012 |
| DE | 10 2012 209 412 A1 | 12/2013 |

* cited by examiner

OPTICAL SYSTEM, AND METHOD

INCORPORATION BY REFERENCE

The content of the priority applications PCT/EP2018/055923 and DE 10 2017 208 364.6 are incorporated by reference in their entirety.

FIELD

The present disclosure relates to an optical system for a lithography apparatus, to a method for producing such an optical system, and to a method for exchanging a mirror of a lithography apparatus for such an optical system.

BACKGROUND

Microlithography is used for producing microstructured components, such as for example integrated circuits. The microlithography process is carried out with a lithography apparatus including an illumination system and a projection system. The image of a mask (reticle) illuminated via the illumination system is in this case projected via the projection system onto a substrate (for example a silicon wafer) coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses that use light with a wavelength in the range of 0.1 nm to 30 nm, in particular 13.5 nm. In the case of such EUV lithography apparatuses, because of the high absorption of light of this wavelength by most materials, reflective optical units, that is to say mirrors, are commonly used instead of refractive optical units, that is to say lens elements.

Mirrors of this type can be positioned and/or oriented in a plurality of degrees of freedom with the aid of a manipulator device, for example with the aid of a so-called Lorentz actuator, during exposure operation. Since the positioning and/or orientation are/is carried out with very high accelerations and with high frequency, it is desirable for mirrors of this type to be very stiff in order to prevent a deformation on account of the repositioning thereof. However, a controlled deformation of a mirror surface is desirable in order to correct imaging aberrations, for example on account of heating of a substrate to be exposed or of the mirror. Generally, such a deformation is only possible, however, if the mirror is correspondingly thin, which in turn is at odds with the demand for the highest possible stiffness.

A deformable thin-walled mirror is described for example in DE 10 2011 081 603 A1. In the case of this adaptive mirror, which is suitable in particular for a microlithographic projection exposure apparatus designed for wavelengths of less than 50 nm, a substrate, an arrangement of electrical leads, an electrically insulating insulation layer and an arrangement of control electrodes that are mutually electrically insulated from one another are arranged one after another. In this case, each control electrode is connected to one of the leads via a conductor element extending through the insulation layer. A piezoelectric layer, a counterelectrode, which extends across a plurality of control electrodes in a projection along a construction direction of the mirror, and a reflective coating are arranged above the control electrode. At least one conductor element is embodied as a buried via. The latter is a region of the insulation layer which has become locally electrically conductive as a result of subsequent and locally delimited irradiation with particles or electromagnetic radiation.

SUMMARY

The present disclosure seeks to provide an improved optical system for a lithography apparatus.

Accordingly, an optical system for a lithography apparatus is provided. The optical system includes a mirror main body, a manipulator device for positioning and/or orienting the mirror main body, an optically effective surface for reflecting radiation, and an actuator matrix arranged between the mirror main body and the optically effective surface and configured to deform the optically effective surface in order to influence the reflection properties thereof, wherein a gap for spacing apart the actuator matrix from the mirror main body is provided between the actuator matrix and a front side of the mirror main body.

A dynamic deformability of the optically effective surface is possible with the aid of the actuator matrix. As a result, by way of example, heat-dictated deformations of the optically effective surface, of the entire optical system or of a wafer to be exposed can be corrected. Alongside the deformability of the optically effective surface, the entire optical system can be positioned and/or oriented with the aid of a manipulator device, without the mirror main body deforming.

The optical system is preferably a mirror, in particular an EUV mirror, for an EUV lithography apparatus. Positioning of the mirror main body should be understood to mean that the latter and thus also the entire optical system is translationally displaceable along a first direction or x-direction, a second direction or y-direction and/or a third direction or z-direction. Orientation of the mirror main body should be understood to mean that the latter is additionally tiltable or rotatable about the directions mentioned above. The y-direction is arranged orthogonally to the x-direction and the z-direction is arranged orthogonally to the x-direction and the y-direction. This results in six degrees of freedom. The manipulator device is preferably a so-called Lorentz actuator or includes at least one or a plurality of Lorentz actuators. The optically effective surface is a highly reflective coating, in particular. The optically effective surface can be configured to reflect EUV radiation or DUV radiation. A three-dimensional geometry of the optically effective surface is variable with the aid of the actuator matrix. The actuator matrix includes a multiplicity of actuators, in particular piezoactuators, which are arranged in matrix form, that is to say in rows and columns. The actuators can be connected to one another. The fact that the reflection properties of the optically effective surface vary should be understood to mean that, for example, the angle of reflection of electromagnetic radiation, in particular EUV radiation or DUV radiation, impinging on the optically effective surface can vary if the optically effective surface is deformed. The mirror main body can have a perforation through which electromagnetic radiation can pass.

EUV stands for "extreme ultraviolet" and denotes a wavelength of the working light of between 0.1 nm and 30 nm. DUV stands for "deep ultraviolet" and denotes a wavelength of the working light of between 30 nm and 250 nm.

In accordance with one embodiment, the mirror main body is flexurally stiff, such that it does not deform during the process of positioning and/or orienting it and/or during the process of deforming the optically effective surface.

The mirror main body is embodied in particular as a solid and integral or monolithic material block. This precludes a deformation of the mirror main body even in the case of a very fast and high-frequency displacement. By way of example, the mirror main body can be a quartz glass block. On account of the stiffness of the mirror main body, the entire optical system can therefore be Lorentz-actuated with high frequency, without the mirror main body deforming.

In accordance with a further embodiment, a mirror substrate is arranged between the optically effective surface and the actuator matrix, the actuator matrix being secured, in particular adhesively bonded or bonded, to the mirror substrate.

The mirror substrate can have a perforation which corresponds to the perforation of the mirror main body and through which electromagnetic radiation can pass. In particular, the actuator matrix is connected to the mirror substrate with the aid of a cohesive connection method. In cohesive connections, the connection partners are held together by atomic or molecular forces. Cohesive connections are non-releasable connections that can be separated only by destruction of the connection mechanism. In the case of bonding, particularly in the case of silicate bonding, the glass surfaces involved are temporarily incipiently dissolved by an alkaline liquid before the moisture is driven out again by a subsequent heat treatment and a cohesive, fixed connection is created. In the case of direct bonding, the glass surfaces are cleaned and activated and hydrophilized using a plasma process. Afterward, the surfaces to be connected are contacted and connected by a heat treatment under pressure in vacuo.

In accordance with a further embodiment, the mirror main body and the mirror substrate are produced from the same material, in particular from quartz glass.

The mirror substrate is preferably thin-walled and shell-shaped in comparison with the mirror main body. As a result, the mirror substrate is elastically deformable in comparison with the mirror main body. The mirror substrate can have a spherical, that is to say sphere-shaped, geometry. The mirror main body preferably has a correspondingly curved front side, on which the mirror substrate is arranged.

In accordance with a further embodiment, the mirror substrate is fixedly connected, in particular adhesively bonded or bonded, to the mirror main body.

Preferably, the mirror substrate is connected to the mirror main body only in regions in which the actuator matrix is not provided. The actuator matrix is provided at a rear side of the mirror substrate, wherein the actuator matrix does not cover the entire rear side. Facing away from the rear side, the mirror substrate has a front side, in particular, at which the optically effective surface is provided.

In accordance with a further embodiment, the actuator matrix is provided at a rear side of the mirror substrate, wherein the optically effective surface, in particular a highly reflective coating, is provided at a front side of the mirror substrate, and wherein a width extent and a length extent of the actuator matrix are greater than a width extent and a length extent of the optically effective surface.

Preferably, the actuator matrix is cohesively connected to the rear side. The optically effective surface can have a rectangular geometry and forms a so-called "footprint" of the optical system or of the mirror substrate. Only the footprint is optically active, that is to say reflects electromagnetic radiation. The actuator matrix is accordingly likewise rectangular and projects beyond the optically effective surface both in the length extent and in the width extent, such that the optically effective surface is also deformable in edge regions.

In accordance with a further embodiment, the actuator matrix is fixedly connected, in particular adhesively bonded or bonded, both to a front side of the mirror main body and to a rear side of the mirror substrate.

Preferably, the actuator matrix is cohesively connected both to the front side and to the rear side. Upon energization of individual actuators of the actuator matrix, they expand in the z-direction. The actuators simultaneously contract in the x-direction. By virtue of the fact that the respective actuator expands in the z-direction and in the process is supported on the front side of the mirror main body and by virtue of the fact that the actuator contracts in the x-direction, the mirror substrate and thus also the optically effective surface deform locally.

A gap for spacing apart the actuator matrix from the mirror main body is provided between the actuator matrix and a front side of the mirror main body.

As a result, the deformation of the optically effective surface is influenced only by the contraction in the x-direction and not by the expansion in the z-direction. The rear side of the mirror substrate is then preferably directly connected to the front side of the mirror main body in the regions in which the actuator matrix is not provided. Upon energization of the actuators, they expand in the z-direction and simultaneously contract in the x-direction. By virtue of the fact that the actuators are not supported on the front side of the mirror main body on account of the gap, the deformation in the z-direction has no influence on the geometry of the optically effective surface. However, the contraction in the x-direction leads to a corresponding deformation of the mirror substrate and of the optically effective surface. The gap is dimensioned such that the actuators never come into contact with the front side of the mirror main body.

In accordance with a further embodiment, the mirror substrate is connected to the mirror main body in the region of the actuator matrix with the aid of pin-type connection elements.

The connection elements can also be referred to as connection pins. The connection elements are preferably produced from the same material as the mirror substrate and the mirror main body. Preferably, the connection elements are adhesively bonded or bonded to the mirror substrate and the mirror main body. The connection elements can be cylindrical. Holes can be provided in the mirror substrate and/or in the mirror main body, the connection elements being accommodated in the holes. The connection elements bridge the gap. The actuator matrix can be omitted in the region of the connection elements.

In accordance with a further embodiment, the mirror substrate is supported on the mirror main body by at least one supporting section.

The gap can be embodied for example as a pocket or cutout. Preferably, however, only one supporting section is provided. In this embodiment of the optical system, the mirror main body can be multipartite, for example, rather than embodied as a monolithic block. In particular, the mirror main body can include a lower part and an upper part. A front side of the lower part can be bonded, in particular planar-bonded, to a rear side of the upper part. The upper part is preferably fixedly connected, in particular adhesively bonded or bonded, to the mirror substrate or is embodied materially in one piece therewith. The upper part is provided with a cutout, in particular, in a region behind the mirror substrate, the cutout forming the gap situated behind the actuator matrix. The mirror substrate can be supported on the lower part on both sides with supporting sections of the upper part. One of the supporting sections is optional in this case. By virtue of the fact that the mirror substrate can be embodied materially in one piece with the upper part, a mirror substrate in the form of a separate component can be dispensed with.

Furthermore, a lithography apparatus, in particular an EUV lithography apparatus or a DUV lithography apparatus, including such an optical system is proposed.

The lithography apparatus can include a plurality of such optical systems. In particular, the optical system can replace a mirror of the lithography apparatus with continuing use of existing interfaces.

Furthermore, a method for producing an optical system is proposed. The method includes the following steps: a) providing a mirror main body blank, b) reducing a thickness of the mirror main body blank in order to obtain a mirror main body, and c) connecting a mirror device to the mirror main body.

The mirror device can include the mirror substrate, the actuator matrix and the optically effective surface. The mirror main body blank is also used for producing known Lorentz-actuated mirrors. By virtue of the fact that the known mirror main body blank is used for producing the optical system, the optical system can be integrated into the lithography apparatus with minimal adaptations. Preferably, the mirror device is cohesively connected, for example adhesively bonded or bonded, to the mirror main body. Reducing the thickness can be carried out with the aid of a material-removing manufacturing method, for example by grinding. By way of example, the mirror main body blank can be provided in step a) also only as a virtual model, in particular as a CAD model (CAD: computer-aided design). The thickness is then likewise reduced virtually. That is to say that the mirror main body can be produced for example directly from a monolithic material block without the intermediate step of producing the mirror main body blank. The mirror main body blank can be ground away for this purpose. Alternatively, an existing mirror can also be demounted from the lithography apparatus and be converted to such an optical system. For this purpose, the mirror is processed in order to obtain the mirror main body, to which the mirror device is then connected.

In accordance with one embodiment, before connecting the mirror device to the mirror main body in step c) the mirror device is produced, and wherein producing the mirror device involves arranging an actuator matrix of the mirror device between the mirror main body and a mirror substrate of the mirror device.

The actuator matrix is arranged between the mirror main body and the mirror substrate in particular in a sandwich-like manner. During the process of producing the mirror device, the mirror substrate is produced as a shell-shaped component.

In accordance with a further embodiment, the actuator matrix is connected, in particular adhesively bonded or bonded, to the mirror substrate before connecting the mirror device to the mirror main body in step c).

The actuator matrix is preferably cohesively connected to the mirror substrate. In particular, the actuator matrix is secured to a rear side of the mirror substrate.

In accordance with a further embodiment, the actuator matrix is connected to a rear side of the mirror substrate, and wherein an optically effective surface, in particular a highly reflective coating, is applied on a front side of the mirror substrate facing away from the actuator matrix.

The optically effective surface is deformed together with the mirror substrate with the aid of the actuator matrix. The actuator matrix is mounted such that it projects beyond the optically effective surface in a length extent and in a width extent.

Furthermore, what is proposed is a method for exchanging a mirror of a lithography apparatus for an optical system including a mirror main body, a manipulator device for positioning and/or orienting the mirror main body, an optically effective surface for reflecting radiation, and an actuator matrix arranged between the mirror main body and the optically effective surface and configured to deform the optically effective surface in order to influence the reflection properties thereof. The method includes the following steps: a) demounting the mirror from the lithography apparatus, and b) installing the optical system into the lithography apparatus, wherein interfaces of the lithography apparatus that are present for the mirror are used during the process of installing the optical system.

The manipulator device is preferably a manipulator device of an existing mirror, which manipulator device is also used for the optical system. In particular, the existing interfaces, in particular actuators, mounts and the component measurement technology of the lithography apparatus, in particular of a projection system of the lithography apparatus, can continue to be used. Furthermore, the optical system has the same dimensions and the same optical design as known mirrors.

Further possible implementations of the disclosure also include not explicitly mentioned combinations of features or embodiments described above or below with respect to the exemplary embodiments. In this case, the person skilled in the art will also add individual aspects as improvements or supplementations to the respective basic form of the disclosure.

Further advantageous configurations and aspects of the disclosure are the subject matter of the dependent claims and also of the exemplary embodiments of the disclosure described below.

BRIEF DESCRIPTION OF THE DRAWINGS

The disclosure is explained in greater detail below on the basis of preferred embodiments with reference to the accompanying figures.

DETAILED DESCRIPTION

In the figures, identical or functionally identical elements have been provided with the same reference signs, unless indicated to the contrary. Insofar as a reference sign has a plurality of reference lines in the present case, this means that the corresponding element is present multiply. Reference sign lines pointing to concealed details are illustrated in a dashed manner. It should also be noted that the illustrations in the figures are not necessarily true to scale.

Figure 1A:
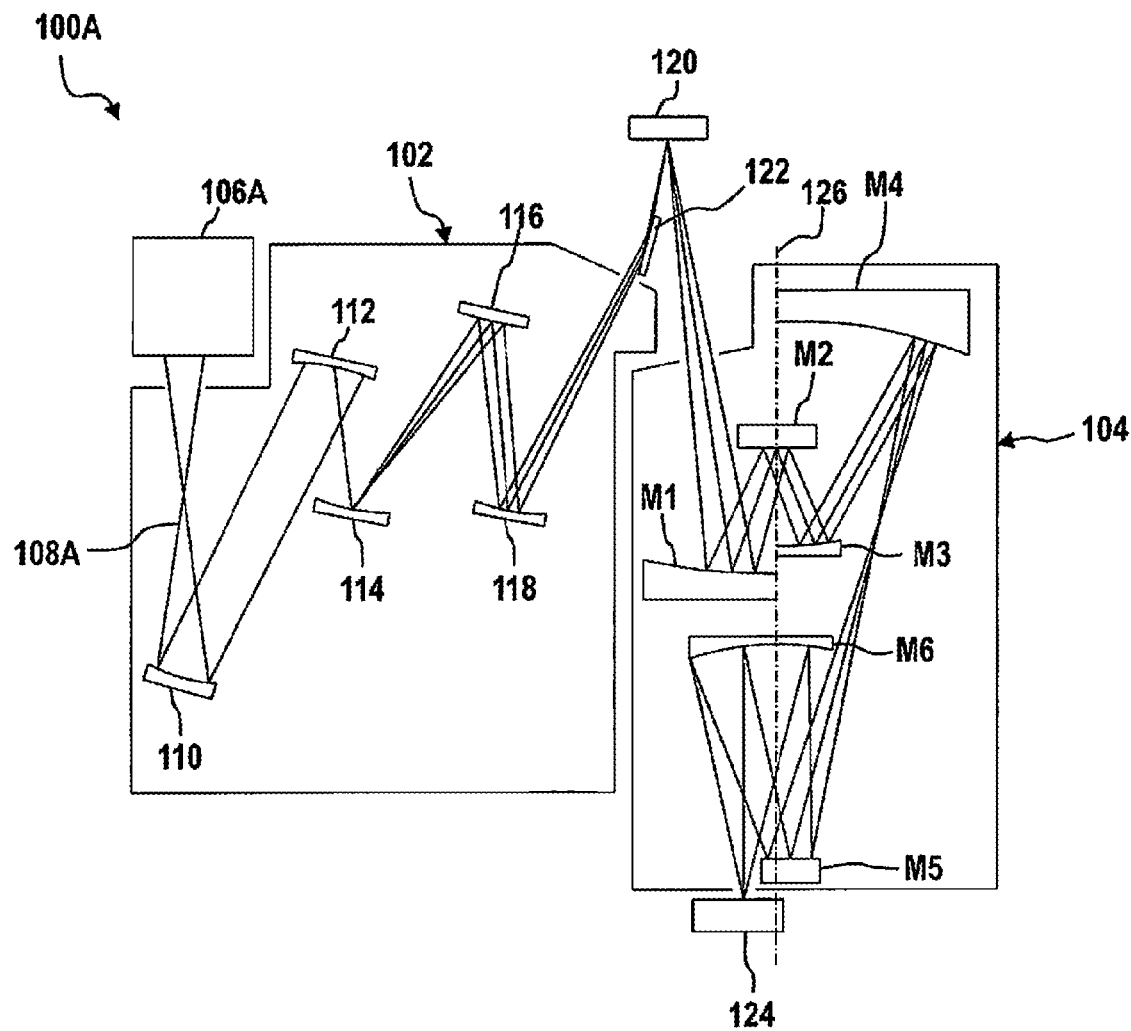
FIG. 1A shows a schematic view of an EUV lithography apparatus.

FIG. 1A shows a schematic view of an EUV lithography apparatus 100A, which includes a beam shaping and illumination system 102 and a projection system 104. In this case, EUV stands for "extreme ultraviolet" and denotes a wavelength of the working light of between 0.1 nm and 30 nm. The beam shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which the drive devices for mechanically moving or adjusting the optical elements are provided. Moreover, electrical controllers and the like can also be provided in this machine room.

The EUV lithography apparatus 100A includes an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is guided onto a photomask (called a reticle) 120. The photomask 120 is likewise embodied as a reflective optical element and can be arranged outside the systems 102, 104. Furthermore, the EUV radiation 108A can be directed onto the photomask 120 via a mirror 122. The photomask 120 has a structure which is imaged onto a wafer 124 or the like in a reduced fashion via the projection system 104.

The projection system 104 (also referred to as projection lens) has six mirrors M1 to M6 for imaging the photomask 120 onto the wafer 124. In this case, individual mirrors M1 to M6 of the projection system 104 can be arranged symmetrically in relation to an optical axis 126 of the projection system 104. It should be noted that the number of mirrors of the EUV lithography apparatus 100A is not restricted to the number illustrated. More or fewer mirrors can also be provided. Furthermore, the mirrors are generally curved on their front side for beam shaping.

Figure 1B:
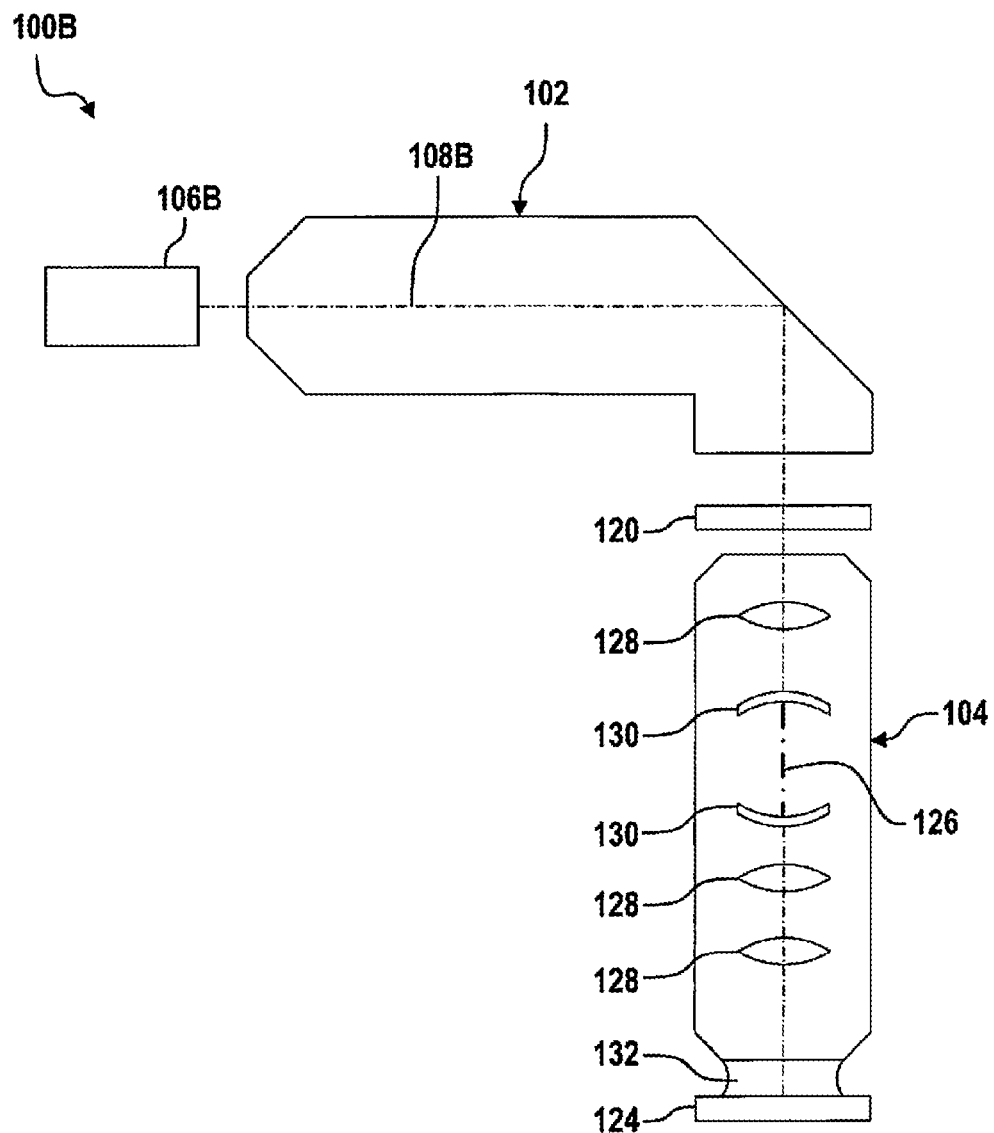
FIG. 1B shows a schematic view of a DUV lithography apparatus.

FIG. 1B shows a schematic view of a DUV lithography apparatus 100B, which includes a beam shaping and illumination system 102 and a projection system 104. In this case, DUV stands for "deep ultraviolet" and denotes a wavelength of the working light of between 30 nm and 250 nm. As has already been described with reference to FIG. 1A, the beam shaping and illumination system 102 and the projection system 104 can be arranged in a vacuum housing and/or surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B guides the DUV radiation 108B onto a photomask 120. The photomask 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to an optical axis 126 of the projection system 104. It should be noted that the number of lens elements and mirrors of the DUV lithography apparatus 100B is not restricted to the number illustrated. More or fewer lens elements and/or mirrors can also be provided. Furthermore, the mirrors are generally curved on their front side for beam shaping.

An air gap between the last lens element 128 and the wafer 124 can be replaced by a liquid medium 132 which has a refractive index of >1. The liquid medium 132 can be high-purity water, for example. Such a construction is also referred to as immersion lithography and has an increased photolithographic resolution.

Figure 2:
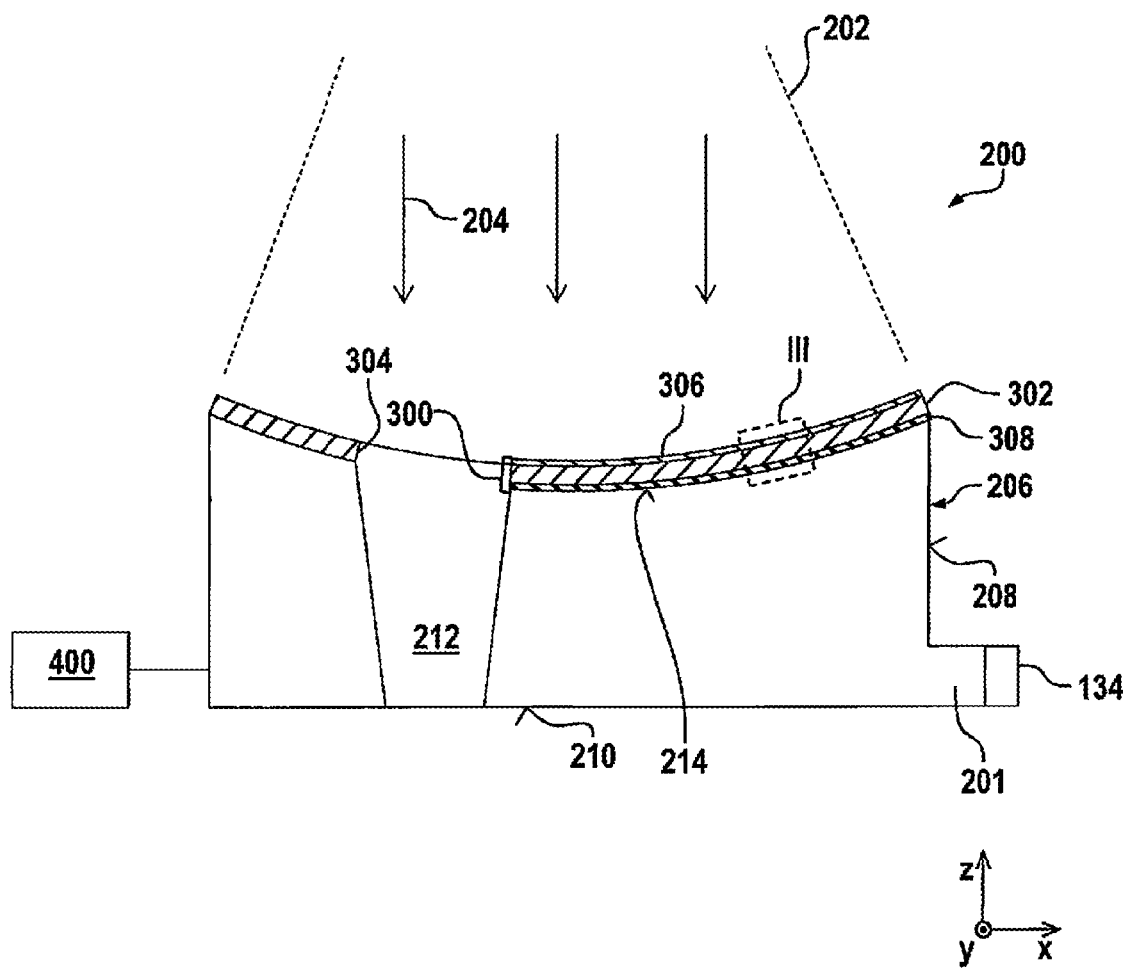
FIG. 2 shows a schematic sectional view of one embodiment of an optical system for a lithography apparatus in accordance with FIG. 1A or 1B.

FIG. 2 shows a schematic sectional view of one embodiment of an optical system 200 for a lithography apparatus, in particular for an EUV or a DUV lithography apparatus 100A, 100B. The optical system 200 is a mirror, in particular an EUV mirror. By way of example, the optical system 200 can replace one of the mirrors M1 to M6, 130 or a further mirror (not shown). In particular, the optical system 200 can be part of a projection system 104.

The optical system 200 includes a beam path 202. During exposure operation, light 204 shines through the optical system 200. The light 204 can be, in particular, the EUV or DUV radiation 108A, 108B (FIG. 1A and FIG. 1B).

The optical system 200 is manipulatable. Actuators can be provided for this purpose. The optical system 200 is preferably Lorentz-actuated. For this purpose, the optical system 200 is assigned a Lorentz actuator, with the aid of which the optical system 200 is tiltable. In this case, an electromagnetic actuator actuates a magnet element. The optical system 200 includes interfaces 201 to the projection system 104, to the actuators and/or to a component measurement technology. By way of example, the optical system 200 is accommodated in a mount assigned to the projection system 104.

The optical system 200 includes a mirror main body 206. The mirror main body 206 is produced from quartz glass, for example. A plurality of interfaces 201 are provided at the mirror main body 206. By way of example, three interfaces 201 distributed around a periphery of the mirror main body 206 are provided. Preferably, the interfaces 201 are produced from the same material as the mirror main body 206. In this case, the interfaces 201 can be embodied materially in one piece with the mirror main body 206. The interfaces 201 are embodied for example as lugs or projections which are provided laterally on the mirror main body 206 and in which a perforation or a hole is provided. The interfaces 201 cooperate with interfaces 134 of the lithography apparatus 100A, 100B, in particular of the projection system 104. The interfaces 134 can include for example a mount, a housing, a thermal link or a component measurement technology.

The mirror main body 206 is embodied as a monolithic, that is to say an integral, block. The mirror main body 206 can also be referred to as a mirror body. The mirror main body 206 can include the interfaces 201 mentioned above. The mirror main body 206 is flexurally stiff. This prevents the mirror main body 206 from deforming when the optical system 200 is actuated. The mirror main body 206 can have a cylindrical, in particular a circular-cylindrical, geometry. The geometry of the mirror main body 206 is however arbitrary, in principle. The mirror main body 206 includes for example an outer or lateral surface 208 and a plane rear side 210 facing away from the beam path 202. A perforation 212 is provided in the mirror main body 206, through which perforation light 204 can pass through the optical system 200.

The mirror main body 206 furthermore includes a curved front side 214 facing the beam path 202. The front side 214 can be curved spherically, for example. In particular, the front side 214 is concave. However, the front side 214 can be an arbitrary three-dimensionally shaped surface.

A mirror device 300 of the optical system 200 is assigned to the front side 214. The mirror device 300 is shell-shaped. The mirror device 300 can also be referred to as a mirror shell or a deformable mirror shell. The mirror device 300 includes a mirror substrate 302, which is preferably produced from the same material as the mirror main body 206. By way of example, the mirror substrate 302 is produced from quartz glass. The mirror substrate 302 is shell-shaped and elastically deformable. The mirror substrate 302 has a perforation 304 which corresponds to the perforation 212 and through which light 204 can pass.

The mirror substrate 302 has an optically effective surface 306 facing away from the front side 214 of the mirror main body 206. The optically effective surface 306 is for example a highly reflective layer suitable for reflecting light 204. The optically effective surface 306 is preferably smaller than a surface of the mirror substrate 302. In particular, the optically effective surface 306 forms a so-called "footprint" of the optical system 200. Only the footprint is optically effective. The optically effective surface 306 is rectangular, for example.

An actuator matrix 308 is arranged between the mirror substrate 302 and the mirror main body 206, the actuator matrix being configured to elastically deform the mirror substrate 302. The actuator matrix 308 includes a multiplicity of actuators, in particular piezoactuators, arranged in grid or matrix form. In this case, the actuator matrix 308 preferably does not cover the entire mirror substrate 302, but rather extends preferably in the region in which the optically effective surface 306 is also provided. That is to say that the actuator matrix 308 is preferably likewise rectangular, wherein a width extent and a length extent of the actuator matrix 308 are greater than a width extent and a length extent of the optically effective surface 306, such that the actuator matrix 308 projects beyond the optically effective surface 306 in each case on both sides in the direction of the length extent and in the direction of the width extent.

The optical system 200 is assigned a manipulator device 400, which is coupled to the mirror main body 206. The manipulator device 400 can include one or a plurality of actuators, in particular Lorentz actuators. With the aid of the manipulator device 400, the mirror main body 206 is positionable in a plurality of degrees of freedom, for example in six degrees of freedom, in particular in three translational and three rotational degrees of freedom. In particular, the mirror main body 206 and thus the optical system 200 is displaceable translationally along a first direction or x-direction x, a second direction or y-direction y and/or a third direction or z-direction z and is additionally tiltable about these directions x, y, z. The mirror main body 206 is displaceable and/or tiltable at high frequency with the aid of the manipulator device 400. That is to say that the mirror main body 206 can be linearly displaced and/or tilted with high frequency. In this case, the mirror main body 206 does not deform owing to its stiffness.

Figure 3:
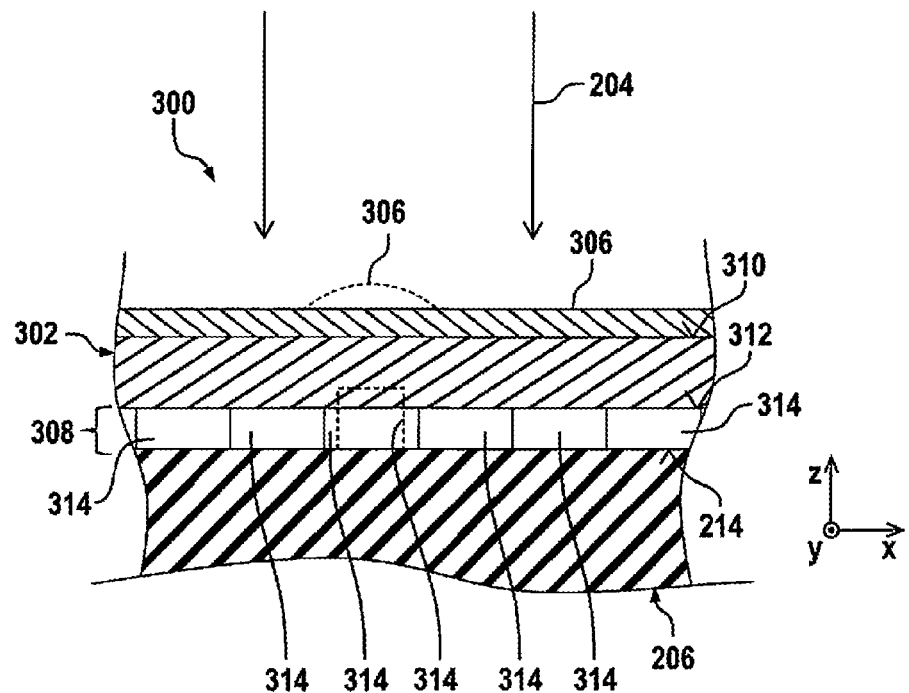
FIG. 3 shows the detail view III in accordance with FIG. 2.

FIG. 3 shows the detail view III in accordance with FIG. 2. As shown by FIG. 3, the optically effective surface 306 is provided at a front side 310 of the mirror substrate 302 and the actuator matrix 308 is provided at a rear side 312 of the mirror substrate 302. The actuator matrix 308 can be adhesively bonded onto the rear side 312 or be bonded to the later. The actuator matrix 308 includes a multiplicity of actuators 314. By way of example, the actuator matrix 308 includes sixteen by eight actuators 314. The actuators 314 contact one another or are connected to one another. Each actuator 314 is drivable individually via cabling (not shown). The actuators 314 can also be fixedly connected, in particular adhesively bonded or bonded, to the front side 214 of the mirror main body 206. The rear side 312 of the mirror substrate 302 is directly connected to the front side 214 of the mirror main body 206 in the regions in which the actuator matrix 308 is not provided. By way of example, the front side 214 and the rear side 312 are adhesively bonded or bonded.

Upon energization of the actuators 314, they expand in the z-direction z. The actuators 314 simultaneously contract in the x-direction x. The energized state of one of the actuators 314 is provided with the reference sign 314' in FIG. 3. By virtue of the fact that the respective actuator 314' expands in the z-direction z and in the process is supported on the front side 214 of the mirror main body 206 and by virtue of the fact that the actuator 314' contracts in the x-direction x, the mirror substrate 302 and thus also the optically effective surface 306 deform locally. A deformed state of the optically effective surface 306 is designated by the reference sign 306' in FIG. 3.

Figure 4:
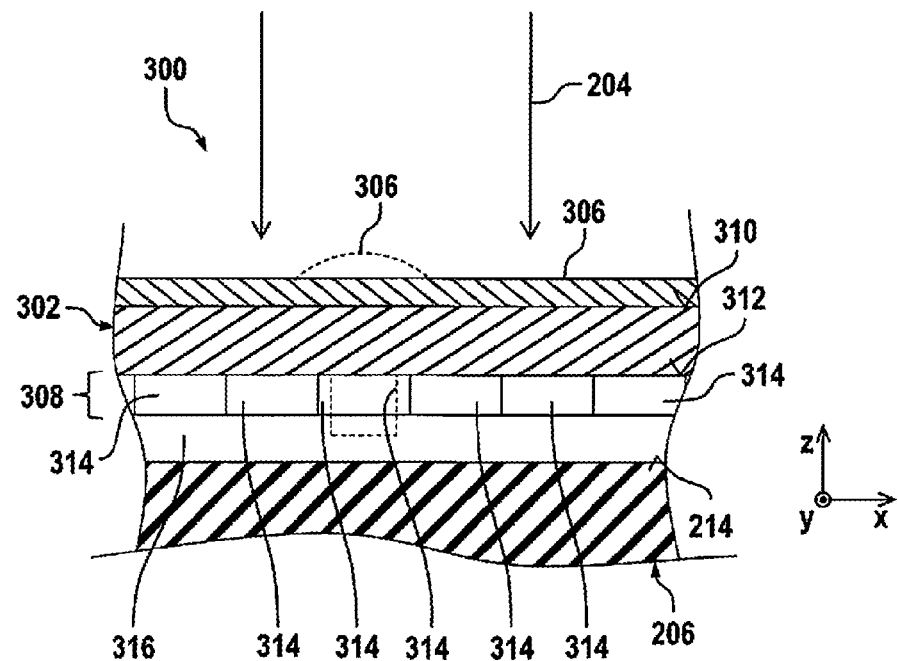
FIG. 4 shows one development of the optical system in accordance with FIG. 2.

FIG. 4 shows one development of the mirror device 300 in accordance with FIG. 3. The mirror device 300 in accordance with FIG. 4 differs from the mirror device 300 in accordance with FIG. 3 in that the actuator matrix 308 is not connected to the front side 214 of the mirror main body 206. A gap 316 is provided between the actuator matrix 308 and the front side 214. The rear side 312 of the mirror substrate 302 is directly connected to the front side 214 of the mirror main body 206 in the regions in which the actuator matrix 308 is not provided. By way of example, the front side 214 and the rear side 312 are adhesively bonded or bonded.

Upon energization of the actuators 314, they expand once again in the z-direction z and simultaneously contract in the x-direction x. One energized actuator 314 is designated by the reference sign 314' in FIG. 4. By virtue of the fact that the actuator 314' is not supported on the front side 214 of the mirror main body 206, the deformation in the z-direction z has no influence on the geometry of the optically effective surface 306. However, the contraction in the x-direction x leads to a corresponding deformation of the mirror substrate 302 and of the optically effective surface 306. The deformed optically effective surface 306 is designated by the reference sign 306' in FIG. 4.

Figure 5:
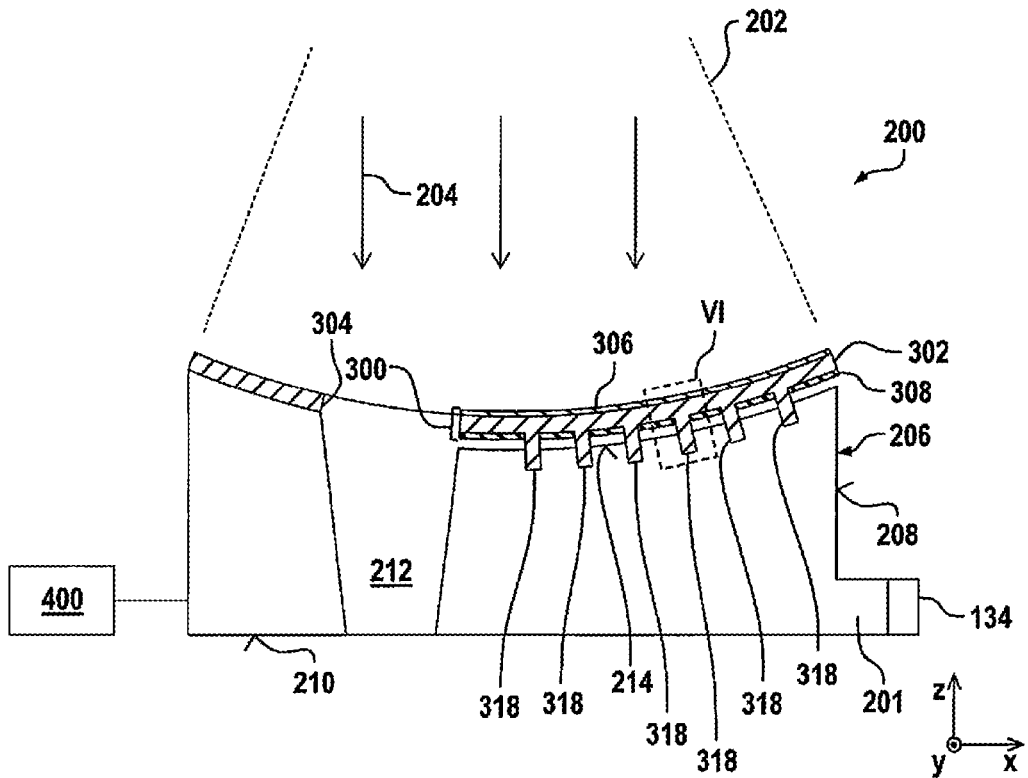
FIG. 5 shows a schematic sectional view of a further embodiment of an optical system for a lithography apparatus in accordance with FIG. 1A or 1B.

FIG. 5 shows a schematic sectional view of a further embodiment of an optical system 200. In this embodiment of the optical system 200, the mirror substrate 302 is fixedly connected to the mirror main body 206 in the region in which the actuator matrix 308 is provided, with the aid of connection pins or connection elements 318.

Figure 6:
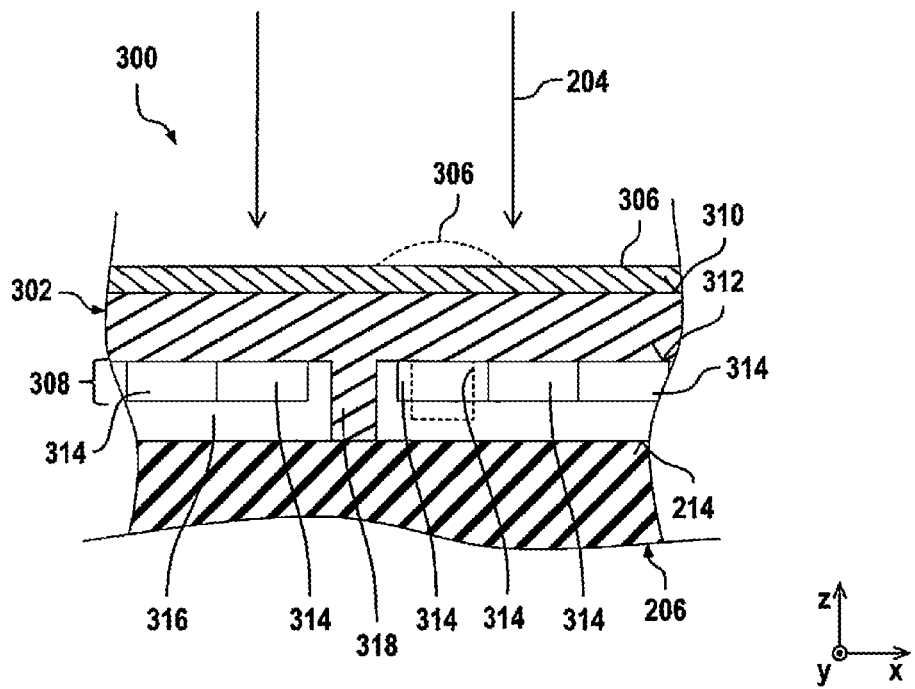
FIG. 6 shows the detail view VI in accordance with FIG. 5.

FIG. 6 shows the detail view VI in accordance with FIG. 5. The connection elements 318 are preferably produced from the same material as the mirror substrate 302 and the mirror main body 206. By way of example, the connection elements 318 are adhesively bonded or bonded to the mirror substrate 302 and the mirror main body 206. The connection elements 318 can be cylindrical. Holes can be provided in the mirror substrate 302 and/or in the mirror main body 206, the connection elements 318 being accommodated in the holes. In this case, the functionality of the mirror device 300 in accordance with FIG. 6 corresponds to the functionality of the mirror device 300 in accordance with FIG. 4.

Figure 7:
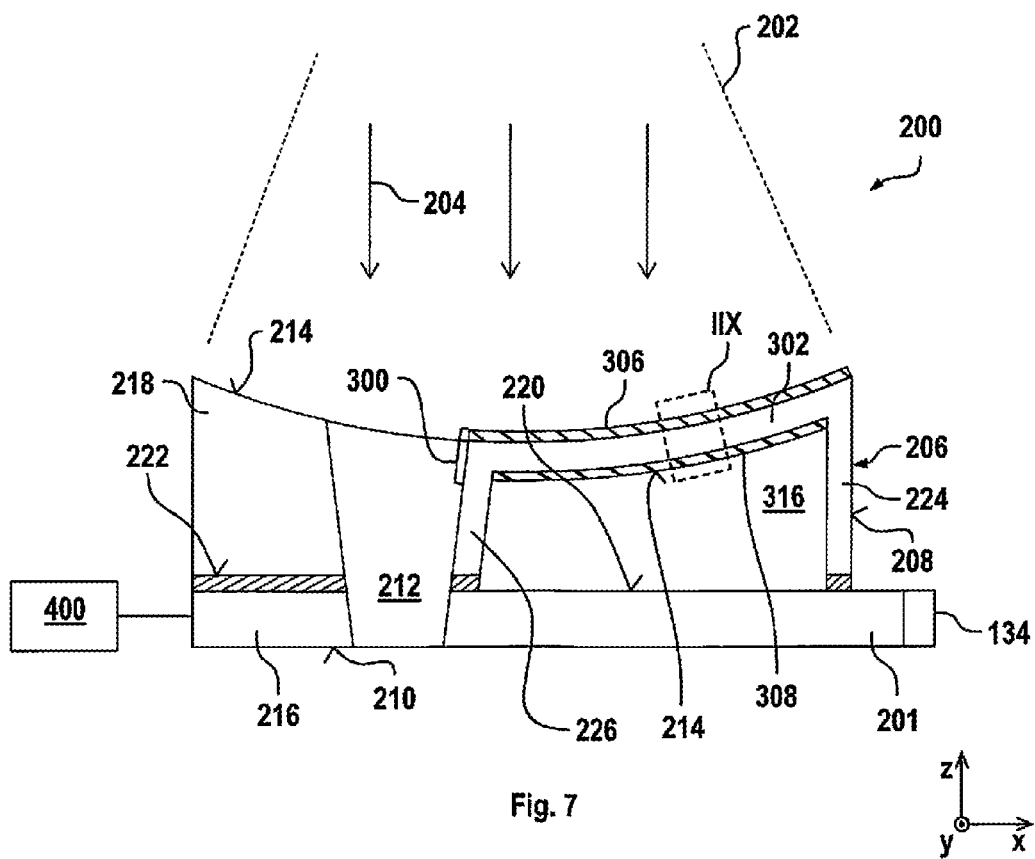
FIG. 7 shows a schematic sectional view of a further embodiment of an optical system for a lithography apparatus in accordance with FIG. 1A or 1B.

FIG. 7 shows a schematic sectional view of a further embodiment of an optical system 200. In this embodiment of the optical system 200, the mirror main body 206 is multipartite, rather than being embodied as a monolithic block. In particular, the mirror main body 206 includes a lower part 216 and an upper part 218. A front side 220 of the lower part 216 is bonded, in particular planar-bonded, to a rear side 222 of the upper part 218. The upper part 218 is fixedly connected, in particular adhesively bonded or bonded, to the mirror substrate 302 or is embodied materially in one piece therewith.

The upper part 218 is provided with a cutout in a region behind the mirror substrate 302, the cutout forming the gap 316. The mirror substrate 320 is supported on the lower part 216 on both sides with supporting sections 224, 226 of the upper part 218. The supporting section 226 is optional in this case. By virtue of the fact that the mirror substrate 302 can be embodied materially in one piece with the upper part 218, a mirror substrate in the form of a separate component can be dispensed with. As in the above-described embodiments of the optical system 200, the actuator matrix 308 is provided at the rear side of the mirror substrate 302.

Figure 8:
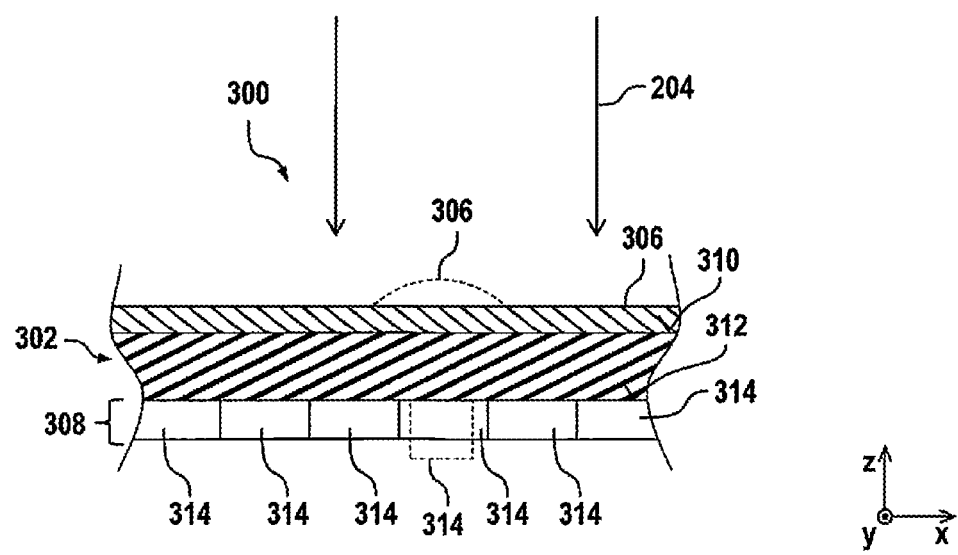
FIG. 8 shows the detail view IIX in accordance with FIG. 7.

FIG. 8 shows the detail view IIX in accordance with FIG. 7. In this case, the functionality of the mirror device 300 in accordance to FIG. 8 corresponds to the functionality of the mirror device 300 in accordance with FIG. 4.

FIGS. 9 to 13 schematically show one embodiment of a method for producing an optical system 200 in accordance with FIG. 2. However, the method is analogously suitable for producing the embodiments of the optical system 200 in accordance with FIGS. 5 and 7.

Figure 9:
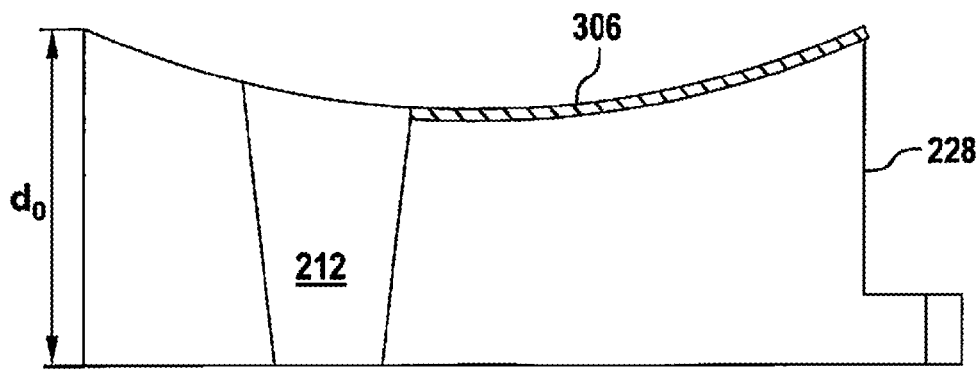
FIG. 9 shows a method step of one embodiment of a method for producing the optical system in accordance with FIG. 2.
Figure 10:
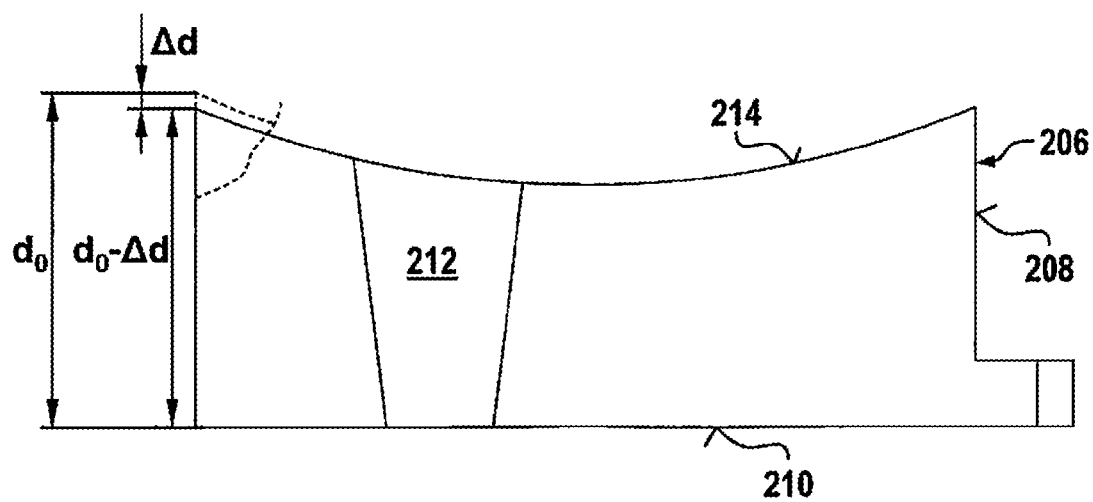
FIG. 10 shows a further method step of the method for producing the optical system in accordance with FIG. 2.
Figure 11:
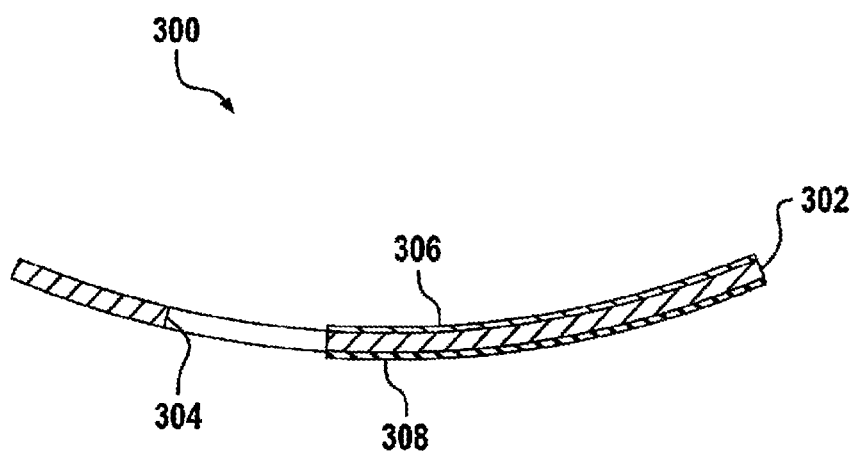
FIG. 11 shows a further method step of the method for producing the optical system in accordance with FIG. 2.
Figure 12:
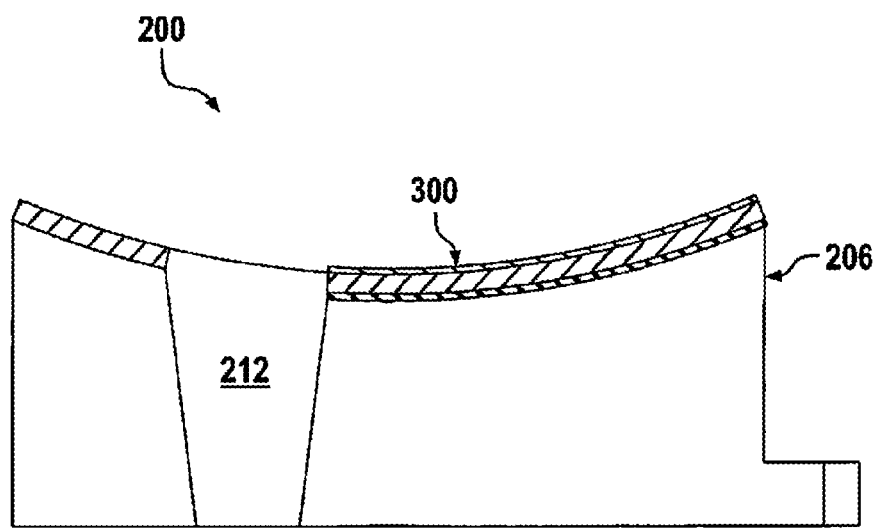
FIG. 12 shows a further method step of the method for producing the optical system in accordance with FIG. 2.
Figure 13:
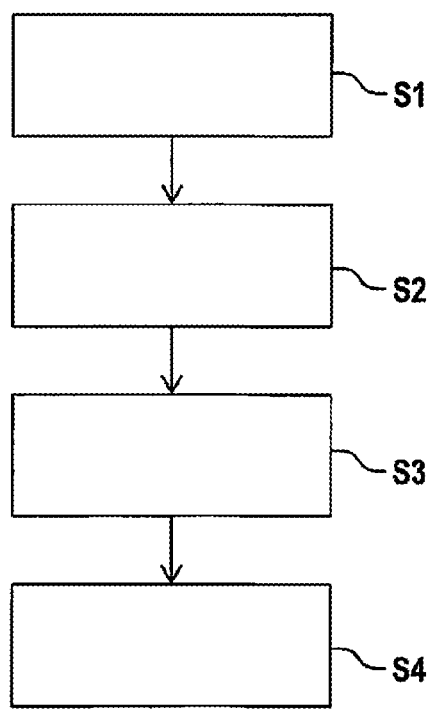
FIG. 13 shows a schematic block diagram of the method in accordance with FIGS. 9 to 12.

As shown in FIGS. 9 and 13, a step S1 involves providing a mirror main body blank 228 such as finds application in lithography apparatuses 100A, 100B for producing actuatable mirrors M1 to M6 or 130. In order to produce such known mirrors M1 to M6 or 130, the mirror main body blank 228 can be provided with an optically effective surface 306.

A step S2 (FIG. 10) involves processing the mirror main body blank 228 in such a way that the mirror main body 206 is formed. For this purpose, a thickness $d_0$ of the mirror main body blank 228 is reduced by a thickness $\Delta d$. This can be done using a removing manufacturing method, for example. The thickness $\Delta d$ is one centimeter, for example.

By way of example, the mirror main body blank 228 can be provided in step S1 also only as a virtual model, in particular as a CAD model. The thickness $d_0$ is then likewise reduced virtually by the thickness $\Delta d$. That is to say that the mirror main body 206 can for example be produced directly from a monolithic material block without the intermediate step of producing the mirror main body blank 228.

In a step S3 (FIG. 11), the mirror device 300 is produced or provided. In this case, the shell-shaped mirror substrate 302 is coated on the front side in order to obtain the optically effective surface 306. The actuator matrix 308 is secured to the mirror substrate 302 on the rear side. The actuator matrix 308 is adhesively bonded or bonded to the mirror substrate 302 on the rear side, for example. In this case, the actuator matrix 308 is provided only in the region of the mirror substrate 302 in which the optically effective surface 306 is also provided.

In a step S4 (FIG. 12), the mirror device 300 is fixedly connected to the mirror main body 206. By way of example, the mirror device 300 is adhesively bonded or bonded onto the mirror main body 206. In this case, the actuator matrix 308 is arranged between the mirror main body 206 and the mirror substrate in a sandwich-like manner.

Figure 14:
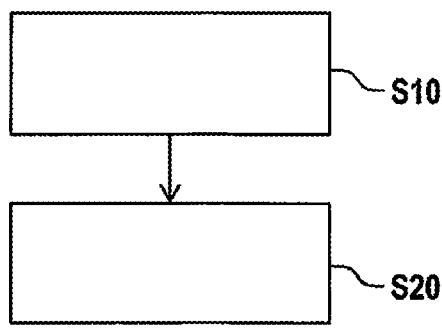
FIG. 14 shows a schematic block diagram of one embodiment of a method for exchanging a mirror of a lithography apparatus for an optical system in accordance with FIG. 2, 5 or 7.

FIG. 14 shows a schematic block diagram of one embodiment of a further method, namely of a method for exchanging a mirror M1 to M6 or 130 of the lithography apparatus 100A, 100B for such an optical system 200. A step S10 involves demounting the corresponding mirror M1 to M6 or 130 from the lithography apparatus 100A, 100B. A further step S20 involves installing the optical system 200 in the lithography apparatus 100A, 100B, wherein the interfaces 134 of the lithography apparatus 100A, 100B that are present for the mirror M1 to M6 or 130 are used during the process of installing the optical system 200. The demounted mirror M1 to M6 or 130 can also be converted into an optical system 200 in the method in accordance with FIG. 13.

By virtue of the fact that the known mirror main body blank 228 is used for producing the optical system 200, the optical system 200 can be integrated into the lithography apparatus 100A, 100B with minimal adaptations. In particular, the existing interfaces 134, in particular actuators, mounts and the component measurement technology of the lithography apparatus 100A, 100B, in particular of the projection system 104, can continue to be used. Furthermore, the optical system 200 has the same dimensions and the same optical design as known mirrors. Furthermore, on account of the stiffness of the mirror main body 206, the entire optical system 200 can be Lorentz-actuated with high frequency, without the mirror main body 206 deforming.

A dynamic deformability of the optically effective surface 306 is possible, however, with the aid of the actuator matrix 308 arranged between the mirror substrate 302 and the mirror main body 206. As a result, by way of example, heat-dictated deformations of the optically effective surface 306 or of the wafer 124 can be corrected (referred to as: field curvature correction).

Although the present disclosure has been described on the basis of exemplary embodiments, it is modifiable in diverse ways.

LIST OF REFERENCE SIGNS

100A EUV lithography apparatus
100B DUV lithography apparatus
102 Beam shaping and illumination system 104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens element
130 Mirror
132 Immersion liquid
134 Interface
200 Optical system
201 Interface
202 Beam path
204 Light
206 Mirror main body
208 Lateral surface
210 Rear side
212 Perforation
214 Front side
216 Lower part
218 Upper part
220 Front side
222 Rear side
224 Supporting section
226 Supporting section
228 Mirror main body blank
300 Mirror device
302 Mirror substrate
304 Perforation
306 Optically effective surface
308 Actuator matrix
310 Front side
312 Rear side
314 Actuator
316 Gap
318 Connection element
400 Manipulator device
$d_0$ Thickness
M1 Mirror
M2 Mirror
M3 Mirror
M4 Mirror
M5 Mirror
M6 Mirror
S1 Step
S2 Step
S3 Step
S4 Step
S10 Step
S20 Step
x x direction
y y direction
z z direction
Δd Thickness

What is claimed is:

1. An optical system, comprising:
a mirror main body;
a manipulator device configured to position and/or orient the mirror main body;
an optically effective surface configured to reflect radiation; and
an actuator matrix between the mirror main body and the optically effective surface,
wherein:
the actuator matrix is configured to deform the optically effective surface to influence reflection properties of the optically effective surface;
a solid-free gap is present between the actuator matrix and a front side of the mirror main body;
the solid-free gap is configured so that, when the actuator matrix is energized to deform actuators of the actuator matrix in a first direction and in a second direction perpendicular to the first direction, deformation of the actuators in the first direction has no influence on deformation of the actuators in the second direction; and
the first direction extends from the actuator matrix to the front side of the mirror main body; and
the optical system is a lithography optical system.

2. The optical system of claim 1, wherein the mirror main body is configured so that,
when positioning and/or orienting the main mirror body, the main mirror body does not deform.

3. The optical system of claim 2, wherein the mirror main body is configured so that, when deforming the optically effective surface, the main mirror body does not deform.

4. The optical system of claim 1, wherein the mirror main body is configured so that, when deforming the optically effective surface, the main mirror body does not deform.

5. The optical system of claim 1, further comprising a mirror substrate between the optically effective surface and the actuator matrix, wherein the actuator matrix is secured to the mirror substrate.

6. The optical system of claim 5, wherein the mirror main body and the mirror substrate comprise the same material.

7. The optical system of claim 5, wherein the mirror main body and the mirror substrate comprise quartz glass.

8. The optical system of claim 5, wherein the mirror substrate is fixedly connected to the mirror main body.

9. The optical system of claim 5, wherein the mirror substrate is bonded to the mirror main body.

10. The optical system of claim 5, wherein:
the actuator matrix is disposed at a rear side of the mirror substrate;
the optically effective surface is disposed at a front side of the mirror substrate; and
a width extent and a length extent of the actuator matrix are greater than a width extent and a length extent of the optically effective surface.

11. The optical system of claim 5, wherein the actuator matrix is fixedly connected both to a front side of the mirror main body and to a rear side of the mirror substrate.

12. The optical system of claim 5, further comprising connection elements connecting the mirror substrate to the mirror main body in the region of the actuator matrix, wherein the connection elements comprise pins.

13. The optical system of claim 5, wherein the mirror substrate is supported on the mirror main body by at least one supporting section.

14. The optical system of claim 5, wherein:
the mirror substrate is fixedly connected to the mirror main body;
the mirror substrate is bonded to the mirror main body;
the actuator matrix is disposed at a rear side of the mirror substrate;

the optically effective surface is disposed at a front side of the mirror substrate; and the actuator matrix is fixedly connected both to a front side of the mirror main body and to a rear side of the mirror substrate.

15. The optical system of claim 1, further comprising a mirror substrate between the optically effective surface and the actuator matrix, wherein the actuator matrix is bonded to the mirror substrate.

16. A method, comprising:

reducing a thickness of a mirror main body blank to provide a mirror main body;

arranging an actuator matrix between the mirror main body and a mirror substrate to provide a mirror device; and connecting the mirror device to the mirror main body such that a solid-free gap is present between the actuator matrix and a front side of the mirror main body, wherein:
the solid-free gap is configured so that, when the actuator matrix is energized to deform actuators of the actuator matrix in a first direction and in a second direction perpendicular to the first direction, deformation of the actuators in the first direction has no influence on deformation of the actuators in the second direction; and the first direction extends from the actuator matrix to the front side of the mirror main body.

17. The method of claim 16, further comprising connecting the actuator matrix to the mirror substrate before connecting the mirror device to the mirror main body.

18. The method of claim 17, further comprising:

connecting the actuator matrix to a rear side of the mirror substrate; and applying an optically effective surface on a front side of the mirror substrate facing away from the actuator matrix.

19. A method of exchanging a mirror of a lithography apparatus for an optical system, the method comprising:

demounting the mirror from the lithography apparatus; and installing the optical system into the lithography apparatus by a process that comprises using interfaces of the lithography apparatus for the mirror, wherein the optical system comprises:
a mirror main body;
a manipulator device configured to position and/or orient the mirror main body;
an optically effective surface configured to reflect radiation; and
an actuator matrix between the mirror main body and the optically effective surface, and wherein:
a solid-free gap is present between the actuator matrix and a front side of the mirror main body;
the actuator matrix is configured to deform the optically effective surface to influence reflection properties of the optically effective surface;
the solid-free gap is configured so that, when the actuator matrix is energized to deform actuators of the actuator matrix in a first direction and in a second direction perpendicular to the first direction, deformation of the actuators in the first direction has no influence on deformation of the actuators in the second direction; and
the first direction extends from the actuator matrix to the front side of the mirror main body.

* * * * *

UNITED STATES PATENT AND TRADEMARK OFFICE
CERTIFICATE OF CORRECTION

PATENT NO. : 10,852,643 B2
APPLICATION NO. : 16/578691
DATED : December 1, 2020
INVENTOR(S) : Dirk Juergens, Kerstin Hild and Bernd Geh Page 1 of 1

It is certified that error appears in the above-identified patent and that said Letters Patent is hereby corrected as shown below:

In the Specification

Column 10, Line 28, delete "later." and insert -- latter. --.

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*